United States Patent
Tsai et al.

(10) Patent No.: US 8,839,157 B2
(45) Date of Patent: Sep. 16, 2014

(54) FLARE EFFECT INDUCED ERROR CORRECTION

(75) Inventors: Yi-Yien Tsai, Bade (TW); Chao-Lung Lo, Jhubei (TW); ChungTe Hsuan, Hsinchu (TW)

(73) Assignee: Macronix International Co., Ltd. (TW)

( * ) Notice: Subject to any disclaimer, the term of this patent is extended or adjusted under 35 U.S.C. 154(b) by 74 days.

(21) Appl. No.: 13/547,840

(22) Filed: Jul. 12, 2012

(65) Prior Publication Data

US 2014/0019919 A1 Jan. 16, 2014

(51) Int. Cl.
*G06F 17/50* (2006.01)
(52) U.S. Cl.
USPC .................. 716/50; 716/51; 716/53

(58) Field of Classification Search
CPC ............... G03F 1/26; G03F 1/36; G03F 7/70; G03F 7/2063
USPC ...................................... 716/50–56
See application file for complete search history.

(56) References Cited

U.S. PATENT DOCUMENTS

| 2007/0032896 | A1* | 2/2007 | Ye et al. ........................ 700/108 |
| 2010/0208978 | A1* | 8/2010 | Terasawa et al. .............. 382/145 |
| 2013/0185681 | A1* | 7/2013 | Liu et al. ......................... 716/51 |

* cited by examiner

*Primary Examiner* — Paul Dinh
(74) *Attorney, Agent, or Firm* — Baker & McKenzie LLP

(57) ABSTRACT

A target pattern is provided including a first pattern in a first region. A sensor pattern is inserted in the target pattern in the first region. A flare intensity of the sensor pattern in the first region is determined. A pattern bias is determined based on the flare intensity.

14 Claims, 4 Drawing Sheets

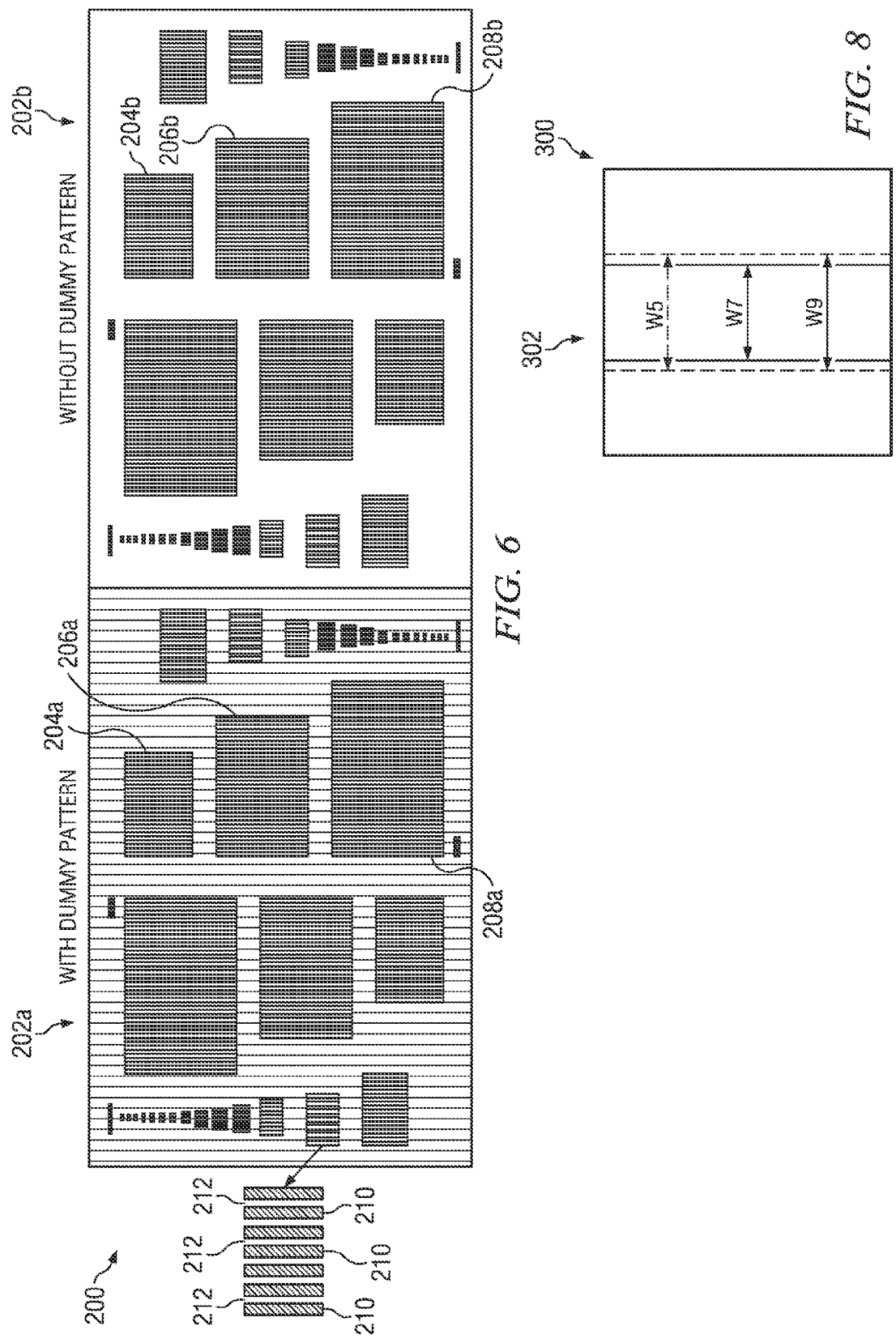

FLARE EFFECT INDUCED ERROR CORRECTION

BACKGROUND

The present application relates generally to semiconductor devices and includes methods and structures for correcting flare effect induced error of mask patterns.

To transfer an integrated circuit pattern onto a layer of a semiconductor device (for example, a semiconductor wafer), a mask pattern sometimes referred to as a photo mask is designed first. The pattern on the mask pattern is then transferred to a layer (for example, a photo resist layer) of the semiconductor device by performing a lithography process (for example, a photolithographic process).

As the design pattern of integrated circuits becomes smaller and the mask pattern becomes of higher density in its pattern arrangement, stray light from nearby openings in the mask, particles in the mask, or defects in a lens between the mask and the layer of the semiconductor device contribute to an error between a target dimension and an actual dimension in a patterned feature referred to as a flare induced error. Thus, the critical dimension (CD) of the pattern may vary from the intended target size due to the flare induced error.

SUMMARY

According to an aspect, a target pattern is provided including a first pattern in a first region. A sensor pattern is inserted in the target pattern in the first region. A flare intensity of the sensor pattern in the first region is determined. A pattern bias is determined based on the flare intensity.

According to another aspect, a reference pattern including a plurality of regions of different pattern size is provided. A layer is simulated with the reference pattern. An error in a dimension of a feature include in at least one of the regions is measured. A model of flare error based on the measured error in dimension of the feature is created. A target dimension is inputted to the model to obtain a flare error. A mask is created according to the flare error.

BRIEF DESCRIPTION OF THE DRAWINGS

FIG. 6 is a top view of a mask pattern.
FIG. 8 is a top view of a wafer.

DETAILED DESCRIPTION

One way to address the problem of the flare induced error is the adoption of a dummy pattern in the mask. A dummy pattern is a pattern added to a mask to change the scattering of stray light, which may affect the induced flare. However, the dummy pattern may only provide a single surrounding pattern density and may not be effective on a densely patterned environment with little available space for the dummy pattern.

Figure 1:
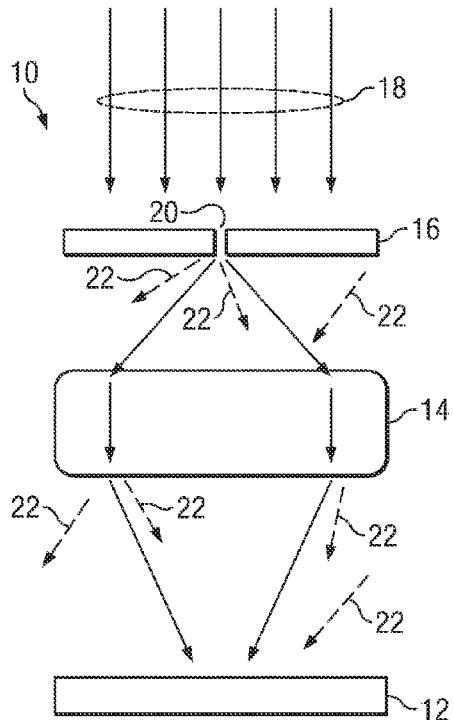
FIG. 1 is system diagram for patterning a wafer.

FIG. 1 shows an exemplary system 10 for patterning a wafer 12. The wafer 12 is positioned below a lens 14, which is positioned below a mask 16. Energy 18, for example from a light source), is supplied to an upper surface of the mask 16. The energy passes through the opening 20 to the lens 14, which focuses the energy on the wafer 12. In this manner, a pattern corresponding to the opening 20 is formed on the wafer 12.

In addition to the energy that passes through the opening 20, stray energy 22 is present due to, for example, scattering from nearby openings in the mask or entering from outside the mask area. This scattering, which is referred to as flare, induces an error in the patterned image.

Figure 2:
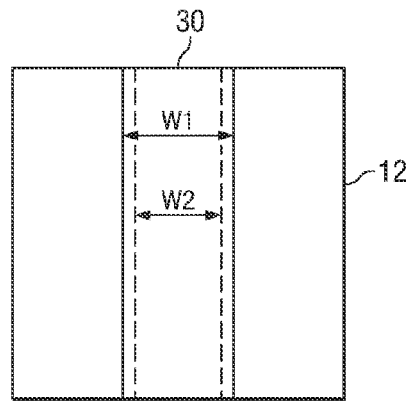
FIG. 2 is a top view of a wafer.

FIG. 2 shows a top view of the wafer 12. The wafer 12 includes a pattern for a line 30, which corresponds with the opening 20 in the mask 16. The line 30 has a width W1. However, a target width for the line 30 is shown as the width W2. A difference between the widths W1 and W2 is caused at least in part by the flare induced error, which overexposed the pattern for the line 30 due to the additional stray energy that reached the region associated with the line 30 during the patterning.

Figure 3:
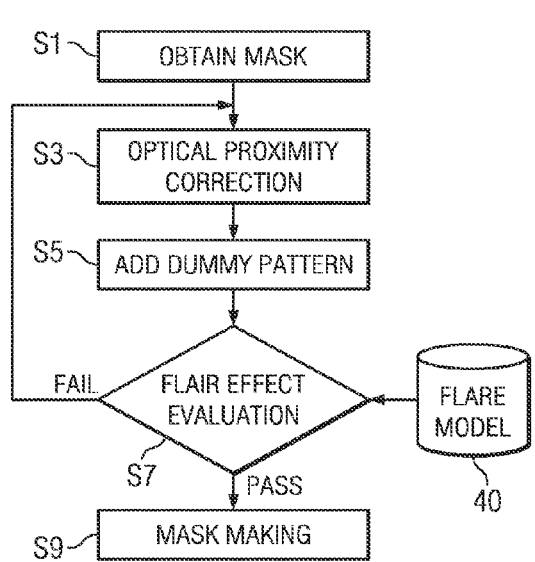
FIG. 3 is a flow chart of a process for correcting flare induced error.

FIG. 3 shows a process for correcting flare induced error. The correction process may be executed by a special purpose processor/computer or a general purpose processor programmed to execute the process. The correction process may also be in the form of computer executable instructions that, when executed by a processor, cause the processor to execute the correction process. The computer executable instructions may be stored on one or more computer readable mediums (e.g., RAM, ROM, etc) in whole or in parts.

At a step S1, a target pattern is obtained. The target pattern may be obtained from a remote database, provided as a file, etc.

At a step S3, optical proximity correction (OPC) is performed on the obtained target pattern. OPC is a process that converts the target pattern into a mask pattern by adjusting for an optical proximity effect that occurs during the lithography process and causes overexposure or underexposure of the layer of the semiconductor device associated with features such as corners in the mask pattern. The optical proximity effect, if not compensated for, can result in a resolution loss that causes the formation of round profiles at corners sometimes referred to as a corner rounding effect and other divergence from the target pattern. This step may be omitted in some embodiments.

At step S5 a dummy pattern is added to the mask pattern. This step may also be omitted in some embodiments.

At step S7, the flare effect is evaluated. The flare effect evaluation includes a simulation of the flare effect and may be based on various flare models 40. A result of the evaluation is the determination of a bias to apply to the mask pattern, which compensates for the flare effect. The flare model 40 may be, for example, a simplified or a general flare model. A general flare model may cover all patterns (all line-width and all pitches) with different environment pattern densities. A simplified flare model may cover one pattern, such as an anchor pattern, with different environment pattern densities. The evaluation of the flare effect is described in further detail with respect to FIG. 4.

If the flare evaluation at step S7 passes, the mask is made at step S9. If the flare evaluation at step S7 fails, the determined bias is applied to the mask pattern and the process returns to step S3 and continues. One example criteria for determining whether the flare evaluation model passes is to determine an average divergence between target critical dimensions of features of the mask pattern and actual/simulated dimensions of those features. Another example criteria is to determine a maximum or worst case divergence of a target critical dimension of a feature and an actual/simulated dimension of that feature. Other evaluation criteria can also be used.

Figure 4:
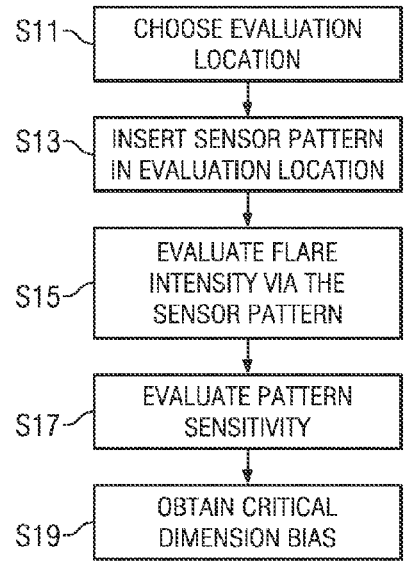
FIG. 4 is a flow chart of a process for evaluating flare effect.

Referring to FIG. 4, the evaluation of the flare effect in step S7 of FIG. 3 is discussed in more detail. At a step S11, an evaluation location is chosen. For example, the mask pattern 100 shown in FIG. 5 may include a region 102 corresponding to a page-buffer in a memory device. To evaluate the flare effect in a location of the page-buffer pattern, the location 104 may be selected.

At a step S13, a pattern in the mask at the location 104 (FIG. 4) is replaced with a sensor pattern 106. The sensor pattern 106 is a portion of an array pattern similar to or the same as an array pattern used in the anchor region 108.

At a step S15, the flare intensity at the sensor pattern is evaluated. A more detailed discussion of evaluating the flare intensity follows below.

At a step S17, the sensitivity of the evaluation location is determined by a simulation process, which is discussed in more detail later.

At step S19, a critical dimension (CD) bias is determined based on the flare intensity and the pattern sensitivity to intensity. A more detailed discussion of determining the critical dimension bias follows below.

Creating the Flare Model

Referring to FIG. 6, a flare model is obtained by measuring the actual flare effect with a test mask pattern having a varied pattern size. The test mask 200 includes regions 202a and 202b. The region 202a includes a dummy pattern. The region 202b does not include a dummy pattern. The regions 202 include sub-regions, such as 204a, 204b, 206a, 206b, 208a and 208b, that have varying pattern size.

The pattern size may range, for example, from 8 um to 1000 um. The number of pattern sizes can vary and may be selected based upon the pattern sizes used in a target mask pattern. For example, 5, 10, 15 or 20 pattern sizes may be used.

In this embodiment, there are 17 different size patterns in each of the regions 202a and 202b of the test mask. The pattern size of these patterns is, for example, from 8 um to 1000 um with a line/space pattern of 90/60 nm (e.g., line 210 and space 212 shown in the inset of FIG. 6). During the processing of the flare model, the CD bias of different size patterns with or without the dummy patterns is simulated under a determined exposure dose. The processing may be performed by computer simulation and provides the change in CD due to flare ($\Delta CD_{flare}$) for the pattern used in the test mask.

In this embodiment, there are 34 total data points (including 17 different size patterns in the region 202a and 17 different size patterns in the region 202b) obtained in the flare model. Such selection of pattern sizes may save data collection time and provide an easier to implement flare model calibration.

Evaluating the Flare Intensity

Figure 5:
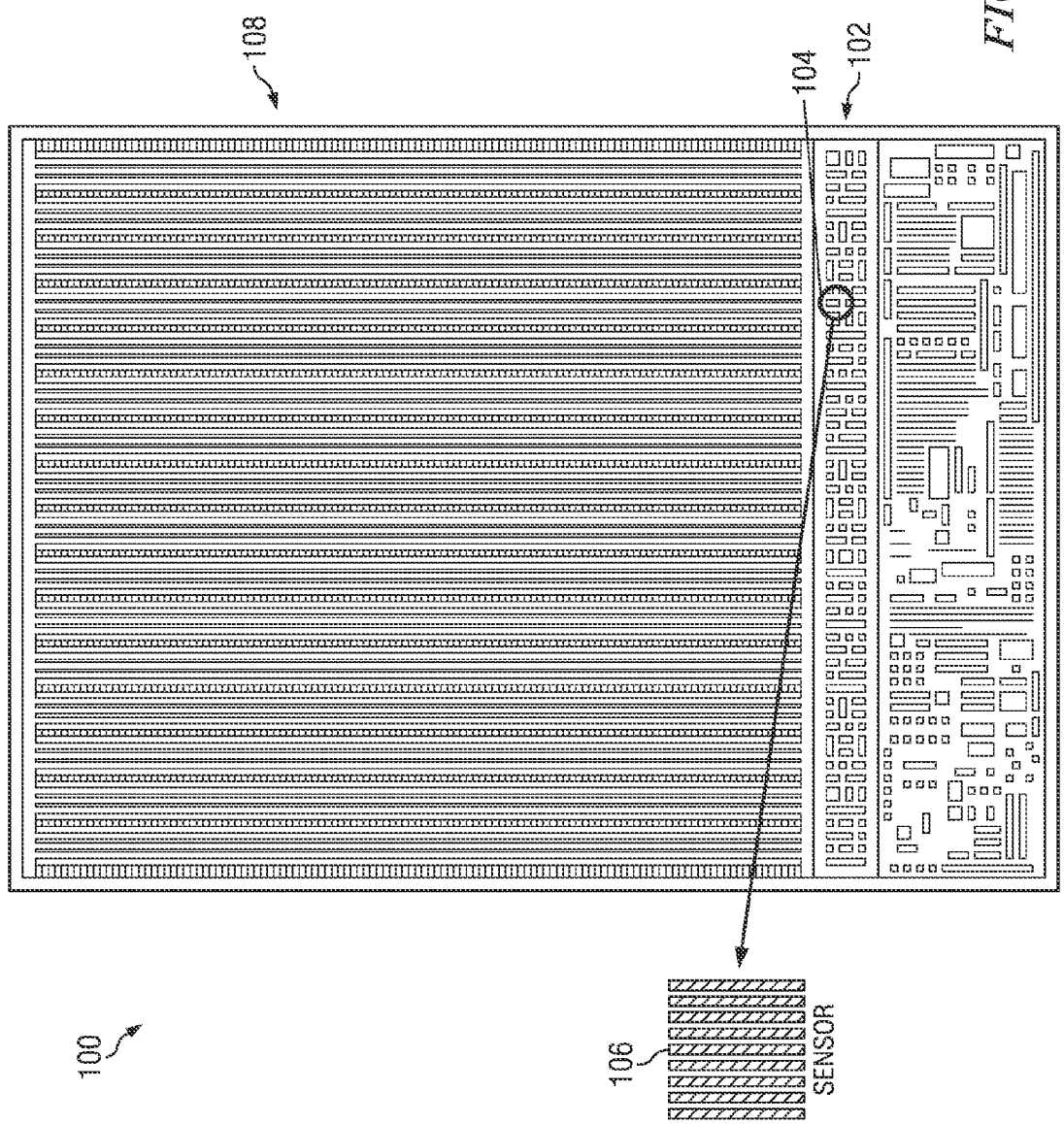
FIG. 5 is a top view of a mask pattern.

Referring to FIG. 5, a sensor pattern 106 has a pattern corresponding to the pattern (referred to as the anchor pattern) of the anchor region 108. The anchor pattern is used to define the determined exposure dose on the wafer because the anchor pattern is the largest area of this mask pattern. In other words, under the determined exposure dose, the critical dimension of the actual pattern formed on the wafer would be the same as the anchor pattern. That is, if the anchor pattern includes lines with a target critical dimension of 90 nm, such as a 90/60 nm line/space pattern, then the actual pattern formed on the wafer will have a critical dimension of 90 nm because the exposure dose on the wafer has been defined to obtain that result.

Then, the critical dimension of the pattern formed by the sensor pattern 106, which is located within the region 102, is simulated by the simplified flare model. The simulation refers to the created flare model with reference to the environment pattern density, such as pattern size, within the region 102 to determine the flare effect on the sensor pattern. For example, based on the simplified flare model, it may be determined that the simulated critical dimension corresponding to the sensor pattern 106 is 90.8 nm. That is, when the anchor pattern is exposed under the determined exposure dose, the critical dimension of the anchor pattern is 90 nm and the sensor pattern would be 90.8 nm due to the flare effect.

Then, the flare intensity ($I_{flare}$) can be calculated according to Equation 1.

$$I_{flare} = (CD_{sensor} - CD_{anchor})/S_{anchor} \qquad \text{(Eq. 1)}$$

S is the pattern critical dimension sensitivity, which is defined as the ratio of the change of critical dimension to the change in applied exposure energy. S is a measure of the CD sensitivity to optical contrast. If the optical contrast is good, the change in exposure dose will have less of an effect on the CD and S will be smaller. If the optical contrast if poor, then the CD may be very sensitive to the change in exposure dose and S will be larger. Generally, S is obtained by simulation. The parameter S and optical sensitivity are discussed in more detail below with respect to FIG. 7.

Figure 7A:
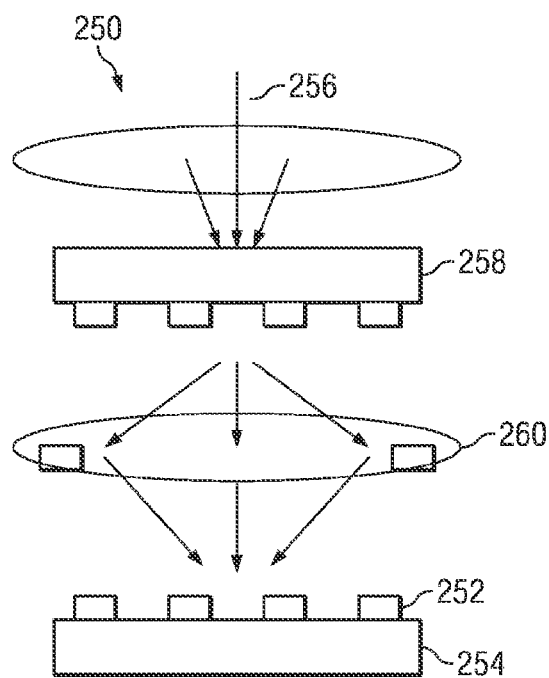
FIG. 7A is a system diagram for patterning a wafer.

FIG. 7A illustrates an exemplary system 250 for patterning a photo resist 252 on a wafer 254. Energy 256 passes through the mask 258 and the lens 260 to the photo resist 252. The pattern formed in the photo resist depends on whether the applied exposure dose of the energy exceeds a threshold of the photo resist. After the photo resist is developed, the portions exposed (or not exposed in the case of the opposite polarity photo resist) are removed. The photo resist 252 is shown in FIG. 6A after development.

Figure 7B:
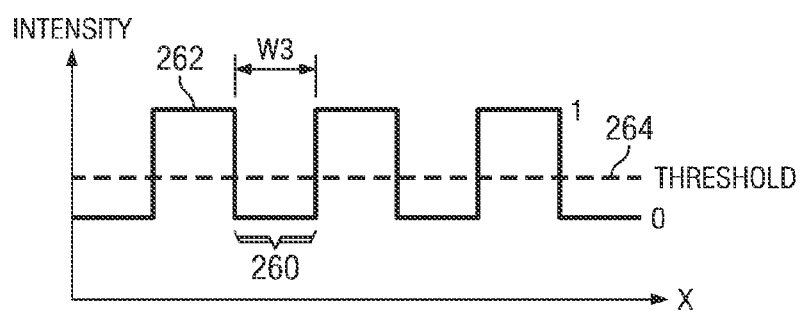
FIGS. 7B and 7C are plots showing optical contrast of an exposure.

FIG. 7B is a plot showing an exposure with high optical contrast. If the overall exposure dose is increased or decreased slightly, the width W3 of a feature 260 is not significantly affected as the exposure profile 262 still crosses the photo resist threshold 264 at substantially the same location. In other words, the slope of the exposure profile 262 is very high where the exposure profile 262 intersects with the threshold 264.

Figure 7C:
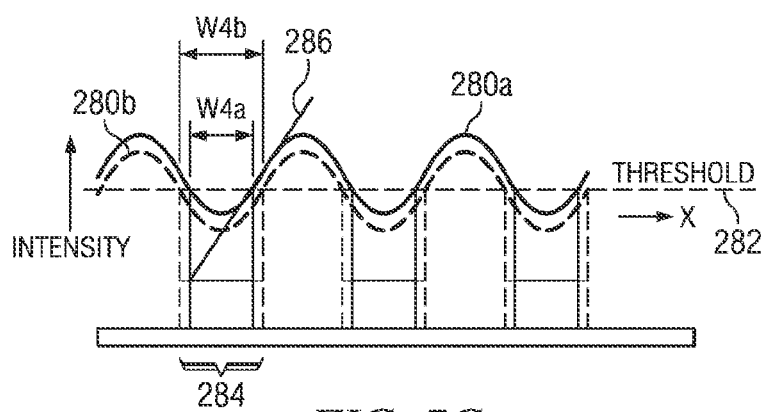

FIG. 7C is a plot showing an exposure with a low optical contrast. The exposure profile 280a may occur, for example, when the CD is smaller than the wavelength of the energy source. In this regime, the diffraction effect is more significant to the intensity on the wafer. In this example, if the exposure dose is decreased, the exposure profile 280a shifts to the exposure profile 280b. Thus, the exposure profiles 280 cross the photo resist threshold 282 at different locations causing a width of a feature 284 to change from W4a to W4b. In other words, the slope 286 of the exposure profiles 280 is not as high where the exposure profile intersects with the threshold 282.

Referring back to Equation 1, $S_{anchor}$ is the ratio of the change of critical dimension to the change in applied exposure energy of the anchor pattern.

For example, the critical dimension of the anchor pattern is 90 nm at a determined exposure dose of 30 mj/cm$^2$. When the dose is increased by 1%, the simulated CD becomes 91.3919 nm. Then, $S_{anchor} = (91.3919 \text{ nm} - 90 \text{ nm})/(0.3 \text{ mj/cm}^2) = 1.3919$ (nm*cm$^2$/0.3 mj) is obtained under the determined exposure dose of 30 mj/cm$^2$. Therefore, the known $S_{anchor}$, $CD_{sensor}$ and $CD_{anchor}$ can be introduced into Eq. 1 to obtain $I_{flare}$. $I_{flare} = (90.8 \text{ nm} - 90 \text{ nm})/(1.3919 \text{ (nm*cm}^2/0.3 \text{ mj}))=0.575$ (0.3 mj/cm$^2$).

Determining the Critical Dimension Bias

The contribution of the flare effect to the change in critical dimension is calculated according to Equation 2.

$$\Delta CD_{flare} = I_{flare} * S_2 \quad \text{(Eq. 2)}$$

$S_2$ is the sensitivity of the original pattern in the location 104. $S_2$ can be calculated in a manner similar to that described above with respect to $S_{anchor}$. For example, $S_2$ may be 1.378 (nm*cm²/0.3 mj) under the determined exposure dose of 30 mj/cm². Thus, applying Eq. 2, $\Delta CD_{flare} = 0.575$ (0.3 mj/cm²) *1.378 (nm*cm²/0.3 mj)=0.79 nm.

In this way, the sensor pattern is used to determine the flare intensity. The flare intensity and the sensitivity at the location 104 is then used to calculate the critical dimension bias due to flare at that location. Different patterns have different sensitivities against optical intensity. Thus, as shown in this example, the critical dimension bias (0.79 nm) is not necessarily the same the simulated error due to the flare effect (0.8 nm) in the sensor pattern. In this example, the pattern in the evaluated location is less sensitive to optical intensity ($S_2$=1.378 (nm*cm²/0.3 mj)) than the pattern used to simulate error due to the flare effect ($S_{anchor}$=1.3919 (nm*cm²/0.3 mj)). By following the above described process, a bias to compensate for the flare induced error of the target pattern can be determined.

Referring to FIG. 8, a wafer 300 includes a feature for a line 302. The line 302 has a target critical dimension W5. However, the corresponding mask pattern does not have a feature of dimension W5, but rather has a feature of dimension W7, which has been reduced by the determined critical dimension bias. Thus, when patterned the actual dimension W9 of the line more closely corresponds to the target critical dimension W5.

Note that the bias applied to the mask may differ from the determined bias if an optical system having a spatial gain is employed in the patterning process. In such a situation, the relative critical dimension bias is applied taking the gain of the optical system and the size of the features of the mask pattern into account.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for correcting a mask pattern, comprising:
   providing a target pattern including a selected pattern in a selected region;
   inserting a sensor pattern into the target pattern in the selected region;
   determining, by a processor, a flare intensity of the sensor pattern in the selected region; and
   determining, by the processor, a pattern bias based on the flare intensity.

2. The method of claim 1, further comprising:
   determining, by the processor, a sensitivity of the selected pattern and a sensitivity of an anchor pattern, the anchor pattern corresponding to the sensor pattern.

3. The method of claim 2, wherein the flare intensity is determined based on a dimension of a feature included in the sensor pattern, a dimension of a feature included in the anchor pattern, and the sensitivity of the anchor pattern.

4. The method of claim 3, wherein the flare intensity is determined as a ratio of the difference between the dimension of the feature included in the sensor pattern and the dimension of the feature included in the anchor pattern to the sensitivity of the anchor pattern.

5. The method of claim 2, wherein the pattern bias is determined based on the flare intensity and the sensitivity of the selected pattern.

6. The method of claim 5, wherein the pattern bias is determined as the flare intensity multiplied by the sensitivity of the selected pattern.

7. The method of claim 2, wherein the sensor pattern is patterned to substantially correspond to the anchor pattern.

8. The method of claim 1, wherein the mask pattern is adjusted based on the pattern bias.

9. The method of claim 8, wherein features of the mask pattern are enlarged according to the pattern bias.

10. The method of claim 9, wherein the determining the flare intensity of the sensor pattern includes simulating a layer patterned by the sensor pattern.

11. The method of claim 10, wherein the simulating the layer patterned by the sensor pattern includes simulating an exposure of the layer to an amount of energy corresponding to the energy required to provide features in the layer of a specific dimension associated with features of an anchor pattern.

12. The method of claim 1, wherein
   the sensor pattern is smaller than an anchor pattern included in the target pattern, and
   the sensor pattern includes features that are the same as features included in the anchor pattern.

13. The method of claim 1, further comprising performing an optical proximity correction on the target pattern to obtain the mask pattern before determining the flare intensity.

14. The method of claim 13, further comprising evaluating whether the pattern bias corrects the mask pattern, wherein the determining the flare intensity is performed on the mask pattern adjusted based on the pattern bias if it is determined that the pattern bias does not correct the mask pattern.

* * * * *